United States Patent
Ryu et al.

(10) Patent No.: US 12,224,479 B2
(45) Date of Patent: Feb. 11, 2025

(54) ELECTRONIC DEVICE COMPRISING AN ANTENNA AND MICROPHONE

(71) Applicant: SAMSUNG ELECTRONICS CO., LTD., Suwon-si (KR)

(72) Inventors: Cheungwon Ryu, Suwon-si (KR); Wondo Ki, Suwon-si (KR); Seongkyoo Byeon, Suwon-si (KR); Junyoung Yang, Suwon-si (KR); Bonam Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 18/107,176

(22) Filed: Feb. 8, 2023

(65) Prior Publication Data
US 2023/0198120 A1    Jun. 22, 2023

Related U.S. Application Data

(63) Continuation of application No. PCT/KR2022/012804, filed on Aug. 26, 2022.

(30) Foreign Application Priority Data

Sep. 3, 2021 (KR) .................. 10-2021-0117759

(51) Int. Cl.
*H01Q 1/22* (2006.01)
*H01Q 5/314* (2015.01)
(Continued)

(52) U.S. Cl.
CPC .............. *H01Q 1/22* (2013.01); *H01Q 5/314* (2015.01); *H04R 1/04* (2013.01); *H04R 1/083* (2013.01); *H05K 1/0243* (2013.01)

(58) Field of Classification Search
CPC .................... H01Q 1/22; H01Q 1/242–243
See application file for complete search history.

(56) References Cited

U.S. PATENT DOCUMENTS

| 7,688,273 B2 | 3/2010 | Montgomery et al. |
| 8,884,836 B2 | 11/2014 | Kim et al. |

(Continued)

FOREIGN PATENT DOCUMENTS

| CN | 109256615 | 1/2019 |
| CN | 109586019 B | 8/2020 |

(Continued)

OTHER PUBLICATIONS

International Search Report for PCT/KR2022/012804, mailed Dec. 29, 2022, 8 pages.

(Continued)

*Primary Examiner* — Jason M Crawford
(74) *Attorney, Agent, or Firm* — Nixon & Vanderhye, P.C.

(57) ABSTRACT

According to an embodiment, an electronic device includes: a housing forming an inner space of the electronic device; a printed circuit board (PCB) disposed in the inner space and including a ground; a microphone module including a microphone housing disposed at a point on the PCB adjacent to a side surface of the housing, the microphone housing being electrically connected with the ground; a conductive member comprising a conductive material disposed, spaced apart from a surface of the microphone housing by a specified distance or less, and overlapping at least part of the microphone housing with reference to a first direction in which a rear surface of the electronic device faces, the conductive member being coupled and electrically connected with the microphone housing; and a wireless communication circuit disposed on the PCB, and the wireless communication circuit is configured to transmit and/or (Continued)

receive a signal of a specified frequency band, based on an electrical path including the conductive member and the microphone housing, by feeding the conductive member.

20 Claims, 10 Drawing Sheets

(51) Int. Cl.
  *H04R 1/04* (2006.01)
  *H04R 1/08* (2006.01)
  *H05K 1/02* (2006.01)

(56) References Cited

U.S. PATENT DOCUMENTS

| | | | | |
|---|---|---|---|---|
| 9,431,693 | B2* | 8/2016 | Kwak | ............... H01Q 1/243 |
| 9,673,508 | B2 | 6/2017 | Lee et al. | |
| 10,403,967 | B1 | 9/2019 | Kim et al. | |
| 10,608,324 | B2* | 3/2020 | Lee | ............... H01Q 9/04 |
| 10,950,932 | B1 | 3/2021 | Ruaro et al. | |
| 2018/0076507 | A1* | 3/2018 | Heo | ............... H01Q 5/378 |
| 2019/0190157 | A1 | 6/2019 | Chang | |
| 2021/0273322 | A1* | 9/2021 | Kim | ............... H01Q 1/243 |
| 2021/0384630 | A1* | 12/2021 | Kim | ............... H01Q 9/42 |
| 2022/0159112 | A1* | 5/2022 | Kim | ............... H05K 1/0239 |
| 2022/0361319 | A1 | 11/2022 | Park et al. | |
| 2023/0198120 | A1* | 6/2023 | Ryu | ............... H01Q 1/22 |
| | | | | 343/702 |
| 2024/0250418 | A1* | 7/2024 | Cho | ............... H04M 1/02 |
| 2024/0297434 | A1* | 9/2024 | Moon | ............... B23K 26/364 |

FOREIGN PATENT DOCUMENTS

| | | | |
|---|---|---|---|
| JP | 2012-239118 | A | 12/2012 |
| JP | 2012239118 | | 12/2012 |
| JP | 5677364 | B2 | 2/2015 |
| KR | 10-2009-0076839 | A | 7/2009 |
| KR | 10-2010-0017207 | A | 2/2010 |
| KR | 10-2010-0109259 | | 10/2010 |
| KR | 10-1165919 | | 7/2012 |
| KR | 10-2012-0097877 | A | 9/2012 |
| KR | 10-2014-0148006 | A | 12/2014 |
| KR | 10-1561912 | | 10/2015 |
| KR | 10-2018-0035605 | A | 4/2018 |
| KR | 10-2019-0114630 | A | 10/2019 |
| KR | 10-2048507 | | 11/2019 |
| KR | 10-2021-0099970 | | 8/2021 |
| WO | 2019/236501 | | 12/2019 |

OTHER PUBLICATIONS

Written Opinion for PCT/KR2022/012804, mailed Dec. 29, 2022, 3 pages.

Extended European Search Report dated Sep. 23, 2024 issued in European Patent Application No. 22864966.1.

* cited by examiner

ELECTRONIC DEVICE COMPRISING AN ANTENNA AND MICROPHONE

CROSS-REFERENCE TO RELATED APPLICATIONS

This application is a continuation of International Application No. PCT/KR2022/012804 designating the United States, filed on Aug. 26, 2022, in the Korean Intellectual Property Receiving Office and claiming priority to Korean Patent Application No. 10-2021-0117759, filed on Sep. 3, 2021, in the Korean Intellectual Property Office, the disclosures of which are incorporated by reference herein in their entireties.

BACKGROUND

Field

The disclosure relates to an electronic device including an antenna and a microphone.

Description of Related Art

An electronic device may include antenna modules which support wireless communication services of various frequency bands, for example, 3G, 4G, or 5G services, etc. A processor (for example, a communication processor (CP)) of the electronic device may perform communication with a base station, and may determine a communication method to use in the electronic device. For example, a wireless communication circuit of the electronic device may perform communication with a base station using one or more of a 3G/4G communication method, or a 5G communication method.

The electronic device may include a microphone module. For example, the electronic device may include the microphone module to provide a communication function to a user. In addition, the electronic device may provide a voice recognition function using the microphone module.

The microphone module mounted in the electronic device may be easily broken by an external impact. Accordingly, the microphone module may include a microphone protection member to be protected from an external impact. For example, the microphone module may include a microphone housing. Durability of the electronic device may be reinforced by providing the microphone housing.

An electronic device may include a battery and/or a display the size of which increases so as to enhance usability of a user using the electronic device. However, the battery and/or the display mounted in the electronic device may have a trade-off relationship with other electronic components. For example, as the size of the battery and/or the display increases, an acoustic module (for example, a microphone module) may be disposed on an area that does not interfere with the battery and/or the display. For example, as areas of the battery and the display increase, the microphone module may be disposed on a periphery of the electronic device.

In addition, an antenna of the electronic device may be required to be disposed, spaced apart from an electronic component (for example, a microphone module) in order to guarantee radiation performance of the antenna. For example, the antenna may be disposed, spaced apart from the microphone module in order to avoid interference between a radio frequency (RF) signal and a microphone signal.

However, as a space for mounting the microphone module is reduced, the microphone and the antenna may be disposed adjacent to each other. For example, the microphone module may be disposed on a periphery of a housing of the electronic device in which the antenna is disposed. Accordingly, since the microphone and the antenna are disposed adjacent to each other, radiation performance of the antenna may be degraded due to interference by the microphone.

SUMMARY

Embodiments of the disclosure address the above-described problems by providing an electronic device including an antenna and a microphone.

According to various example embodiments of the disclosure, an electronic device may include: a housing forming an inner space of the electronic device; a printed circuit board (PCB) disposed in the inner space and including a ground; a microphone module including a microphone housing disposed at a point on the PCB adjacent to a side surface of the housing, the microphone housing being electrically connected with the ground; a conductive member comprising a conductive material disposed, spaced apart from a surface of the microphone housing by a specified distance or less, and overlapping at least part of the microphone housing with reference to a first direction in which a rear surface of the electronic device faces, the conductive member being coupled and electrically connected with the microphone housing; and a wireless communication circuit disposed on the PCB, wherein the wireless communication circuit is configured to transmit and/or receive a signal of a designated frequency band, based on an electrical path including the conductive member and the microphone housing, by feeding the conductive member.

According to various example embodiments of the disclosure, an electronic device may include: a housing configured forming an inner space of the electronic device, a part of the housing comprising a conductive member comprising a conductive material; a printed circuit board (PCB) disposed in the inner space and including a ground; a microphone module including a microphone housing disposed at a point on the PCB adjacent to a side surface of the housing, the microphone housing being electrically connected with the ground; and a wireless communication circuit disposed on the PCB, wherein the conductive member may be disposed, spaced apart from a surface of the microphone housing by a specified distance or less, and overlapping at least part of the microphone housing with reference to a second direction perpendicular to a first direction in which a rear surface of the electronic device faces, wherein the conductive member and the microphone housing may be coupled and electrically connected, and the wireless communication circuit may be configured to transmit and/or receive a signal of a designated frequency band, based on an electrical path including the conductive member and the microphone housing, by feeding the conductive member.

According to various example embodiments of the disclosure, the electronic device may not include an electrical connection member (for example, a c-clip). For example, the electronic device may transmit and/or receive a signal of a designated frequency band using the microphone housing as an electrical path, instead of an electrical connection member.

Since the electronic device does not include an electrical connection member, the electronic device may provide a space for mounting other electronic components (for example, an additional battery). By adding other electronic components, the electronic device may increase usability of a user.

In addition, according to various example embodiments, an antenna and the microphone housing may be coupled and electrically connected, such that the electronic device may provide substantially the same radiation performance as an antenna including the electrical connection member.

In addition, various effects that are directly or indirectly understood through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

Regarding explanation of the drawings, the same or similar reference numerals may be used for the same or similar components.

DETAILED DESCRIPTION

Various example embodiments of the disclosure will be described in greater detail below with reference to the accompanying drawings. However, these are not intended to limit the disclosure to specific embodiments, and should be understood as including various modifications, equivalents, and/or alternatives of embodiments of the disclosure.

Figure 1:
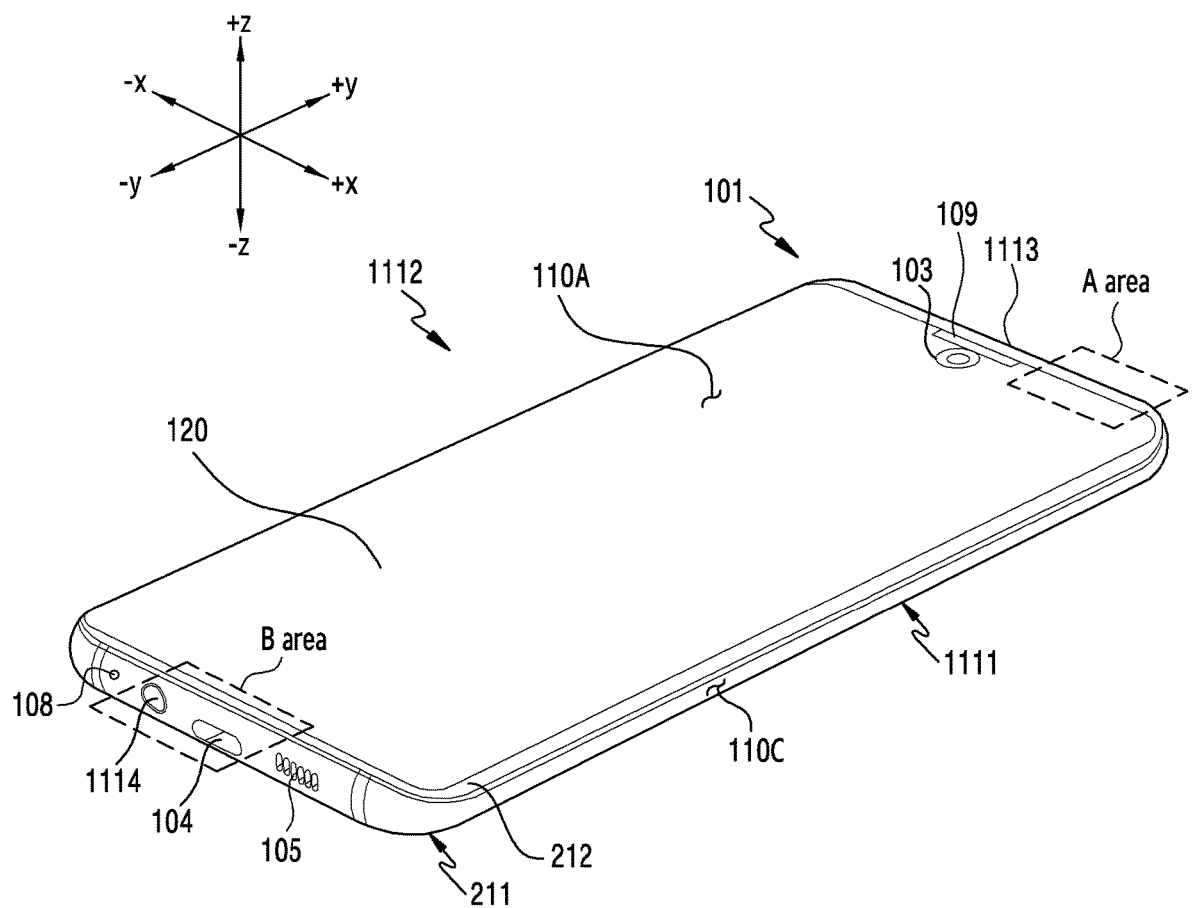
FIG. 1 is a front perspective view illustrating an example electronic device according to various embodiments.

FIG. 1 is a front perspective view of an electronic device 101 according to various embodiments.

Figure 2:
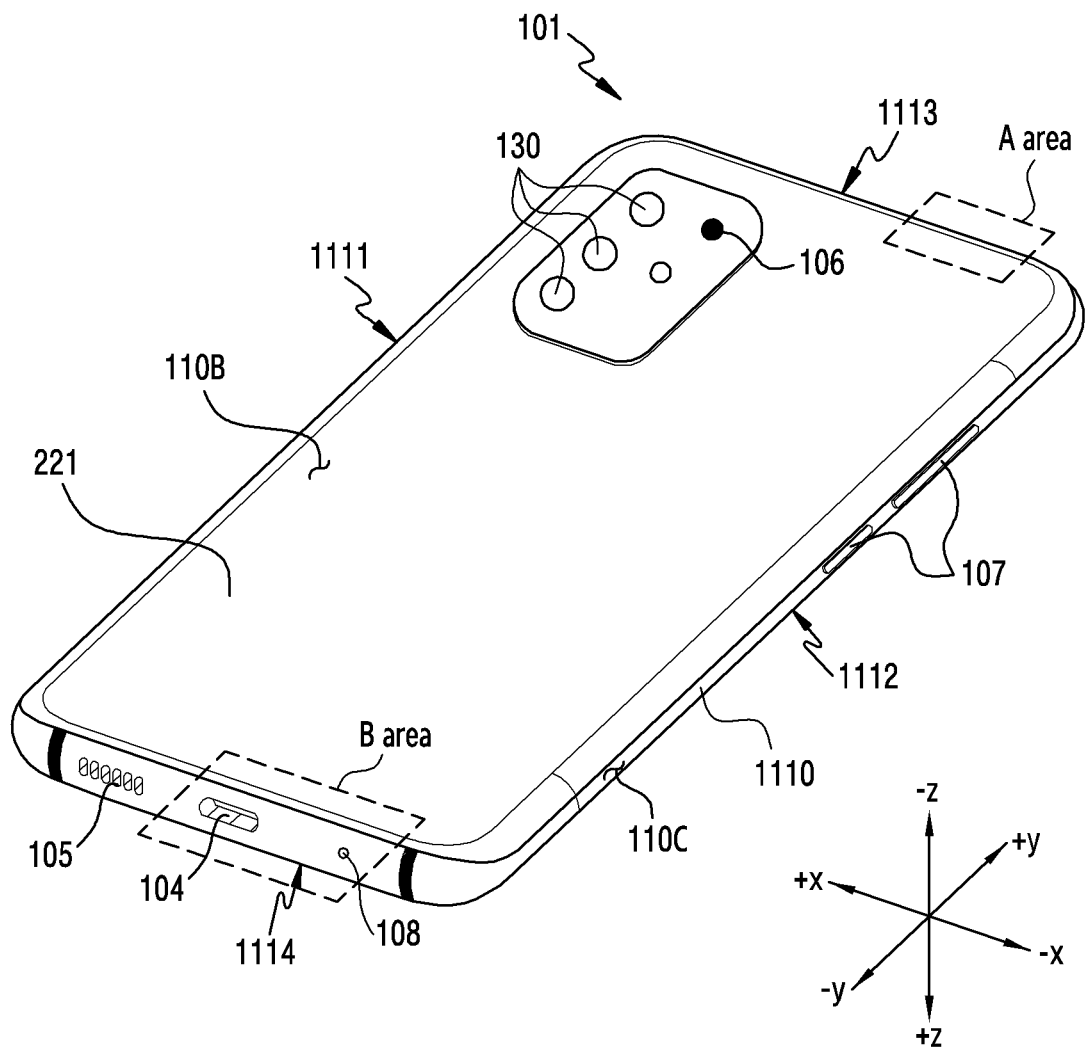
FIG. 2 is a rear perspective view illustrating the electronic device according to various embodiments.

FIG. 2 is a rear perspective view of the electronic device 101 according to various embodiments.

Referring to FIGS. 1 and 2, the electronic device 101 according to an embodiment may include a housing 110 which includes a first surface (or a front surface) 110A, a second surface (or a rear surface) 110B, and a side surface 110C surrounding a space between the first surface 110A and the second surface 110B. In an embodiment, the housing 110 may refer to a structure that forms a part of the first surface 110A, the second surface 110B, and the side surface 110C.

According to an embodiment, the first surface 110A may be formed by a front surface plate 211 having at least part substantially transparent (for example, a glass plate including various coating layers, or a polymer plate). In an example, the front surface plate 211 may include a curved portion 212 which is bent from the first surface 110A toward a rear surface plate 221 on at least side edge portion and is seamlessly extended.

In an embodiment, the second surface 110B may be formed by the rear surface plate 221 which is substantially opaque. In an example, the rear surface plate 111 may be formed by, for example, coated or colored glass, ceramic, a polymer, metal (for example, aluminum, stainless steel (STS), or magnesium), or a combination of at least two of the above-mentioned materials. In an example, the rear surface plate 221 may include a curved portion which is bent from the second surface 110B toward the front surface plate 211 on at least side edge portion and is seamlessly extended.

In an embodiment, the side surface 110C may be formed by a side surface member (or a side surface bezel structure or a sidewall) which is coupled with the front surface plate 211 and the rear surface plate 221, and includes metal and/or a polymer. In an example, the side surface 110C may include a first side surface 111 which is positioned on a right side (for example, the +x direction of FIG. 2) of the electronic device 101 and is extended along a first direction (for example, the +y direction of FIG. 2), a second side surface 112 which is parallel to the first side surface 1111 and is extended along the first direction, a third side surface 1113 which is extended along a second direction (for example, the +x direction of FIG. 1) perpendicular to the first direction, and connects one end of the first side surface 111 (for example, one end in the +y direction of FIG. 1) and one end of the second side surface 1112 (for example, one end in the +y direction of FIG. 1), and/or a fourth side surface 1114 which is parallel to the third side surface 1113 and connects the other end of the first side surface 111 (for example, one end in the -y direction of FIG. 1) and the other end of the second side surface 1112 (for example, on end in the -y direction of FIG. 1).

According to an embodiment, the electronic device 101 may include at least one of a display 120, a first optical sensor (for example, a sensor module and/or a camera module) 130, a camera hole 103, a receiver hole 109, a connector hole 104, a microphone hole 108, or a speaker hole 105. In an example, the electronic device 101 may omit at least one of the components or may additionally include other components. For example, the electronic device 101 may further include a sensor module (not shown). The electronic device 101 may omit a key input device 107.

In an embodiment, a sensor such as a proximity sensor, an illuminance sensor, an image sensor, or an iris sensor may be integrated into the display 120 within an area provided by the front surface plate 121, or may be disposed adjacent to the display 120.

In an embodiment, the display 120 may be visually exposed (e.g., visible) through a substantial portion of the front surface plate 211. In an example, the display 120 may be coupled with or disposed adjacent to a touch sensing circuit, a pressure sensor for measuring an intensity (pressure) of a touch, and/or a digitizer for detecting a stylus pen of a magnetic field method. In an example, a corner of the display 120 may be formed substantially the same as a shape (for example, a curved surface) of an outside border of the front surface plate 211 adjacent thereto.

In an embodiment, the connector hole 104 may accommodate a connector for transmitting and receiving power and/or data to and from an external electronic device (for example, the electronic device 101 of FIG. 1), and/or a connector for transmitting and receiving audio signals to and from an external electronic device. For example, the connector hole 104 may include a USB connector or an earphone jack (not shown) (or an "earphone interface"). In an embodiment, the USB connector and the earphone jack may be implemented by one hole, and in an embodiment, the electronic device 101 may transmit and receive power and/or data to and from an external device, or may transmit and receive audio signals without a separate connector hole.

The microphone hole 108 may have a microphone disposed therein to acquire an external sound, and may have a plurality of microphones disposed therein to detect a direction of a sound. In addition, the speaker hole 105 may have a speaker disposed therein to emit an external sound. In another example, the speaker hole 105 and the microphone hole 108 may be implemented by one hole or a speaker (for example, a piezo speaker) may be included without a speaker hole. The speaker hole may include an external speaker hole and a receiver hole for communication.

In an embodiment, referring to FIG. 2, the key input device 107 may be disposed on the side surface 110C of the housing 110. In an embodiment, the electronic device 101 may not include a part or an entirety of the key input device 107 mentioned above, and the key input device 107 that is not included may be implemented on the display 120 in other forms such as a soft key. In an example, the key input device 107 may include at least part of a fingerprint sensor disposed on the second surface 110B of the housing 110.

In an embodiment, a second optical sensor 130 and a third optical sensor 106 may be disposed on the second surface 110B of the electronic device 101. The second optical sensor 130 may include a plurality of cameras. In an example, the third optical sensor 106 may include a flash. In an example, the first optical sensor 130, the second optical sensor 130 and the third optical sensor 106 may include one lens or a plurality of lenses, an image sensor, and/or an image processor. The third optical sensor 106 may include a light emitting diode or a xenon lamp. In an example, two or more lenses (an infrared camera, a wide-angle lens and/or a telephoto lens) and image sensors may be disposed on one surface of the electronic device 101.

In an embodiment, the electronic device 101 may include a sensor module, which is not illustrated, to generate an electronic signal or a data value corresponding to an internal operation state or an external environment state. The electronic device 101 may further include a sensor module, which is not illustrated, for example, at least one of a gesture sensor, a gyro sensor, an atmospheric pressure sensor, a magnetic sensor, an acceleration sensor, a grip sensor, a color sensor, an infrared (IR) sensor, a temperature sensor, or a humidity sensor.

Figure 3:
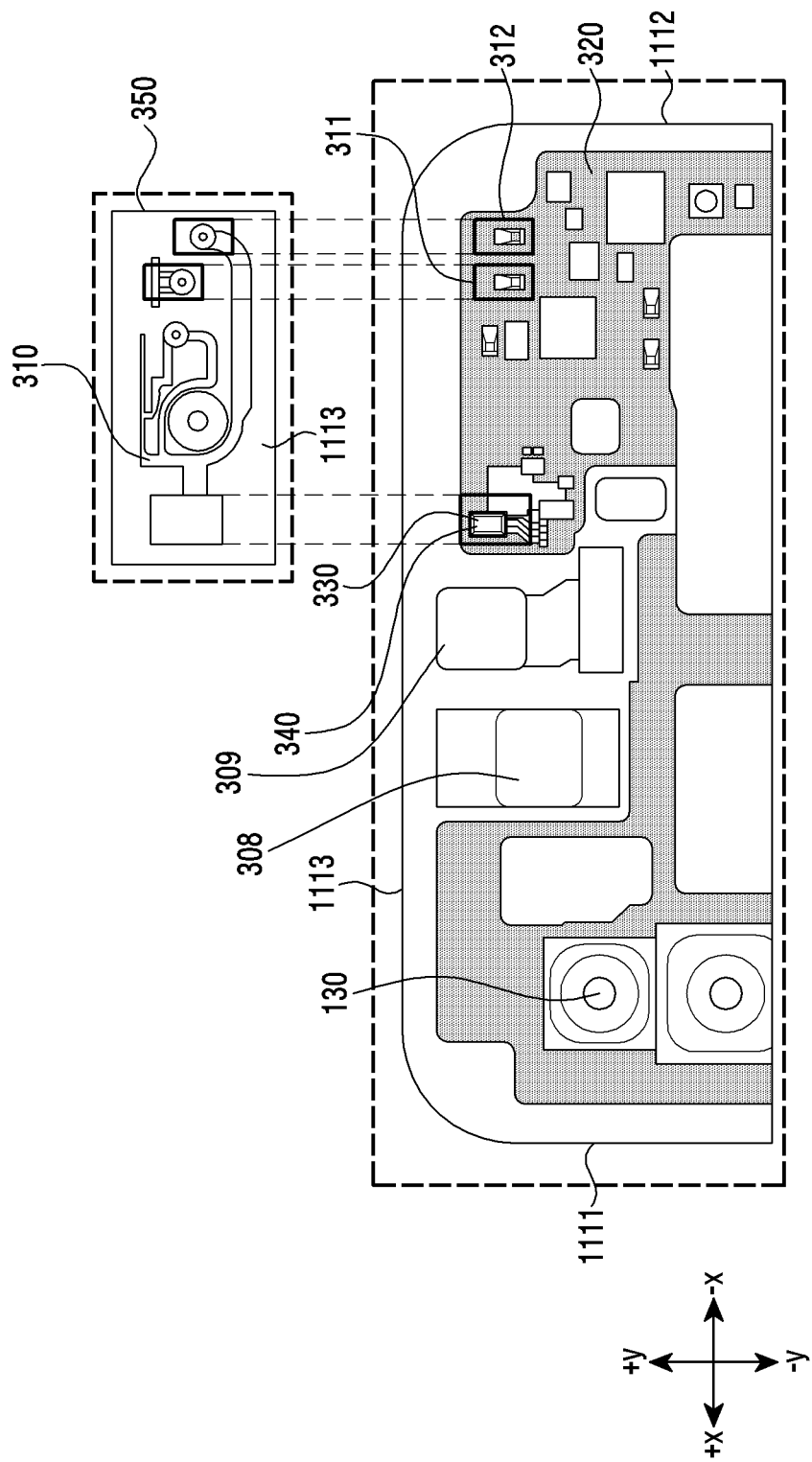
FIG. 3 is a diagram illustrating the area A of FIG. 2 of the electronic device according to various embodiments.

FIG. 3 is a diagram illustrating the area A of the interior of the electronic device of FIGS. 1 and 2 101 according to various embodiments.

According to an embodiment, FIG. 3 illustrates the interior of the rear surface 110B of the electronic device 101.

According to an embodiment, FIG. 3 is a view illustrating a conductive member (e.g., comprising a conductive material) 310 which is used as an antenna radiator of the electronic device 101, a microphone housing 340 which faces at least part of the conductive member 310, and a printed circuit board (PCB) 320 which is formed in an inner space of the electronic device 101.

According to an embodiment, the electronic device 101 may include the housing 110, the PCB 320, a microphone module 330, a wireless communication circuit, and the conductive member 310.

According to an embodiment, the housing 110 may form the inner space of the electronic device 101. According to an embodiment, a plurality of electronic components (for example, the PCB 320, the camera module 130, and the USB connector) may be mounted in the inner space of the electronic device 101 which is formed by the housing 110. In an example, the camera module 130 may be disposed in the inner space of the electronic device 101 which is adjacent to the first side surface 1111 and the third side surface 1113 of the housing 110. According to an embodiment, the USB connector may be disposed in the inner space of the electronic device 101 which is adjacent to the fourth side surface (for example, 1114 of FIGS. 1 and 2) of the housing 110.

According to an embodiment, the third side surface 1113 may correspond to a side surface that is formed on an upper end of the electronic device 101. In addition, the fourth side surface (for example, 1114 of FIGS. 1 and 2) may correspond to a side surface that is formed on a lower end of the electronic device 101.

According to an embodiment, at least one PCB 320 may be disposed in the inner space of the electronic device 101.

According to an embodiment, a plurality of electronic components mounted inside the electronic device 101 may be electrically connected with the at least one PCB 320. For example, the PCB 320 may be electrically connected with the camera module 130. In addition, according to an embodiment, the PCB 320 may be electrically connected with the microphone module 330.

According to an embodiment, the PCB 320 may be electrically connected with the camera module 130 and the microphone module 330, such that a processor and/or a control module of the electronic device 101 may electrically control the camera module 130 and the microphone module 330 through the PCB 320.

According to an embodiment, the PCB 320 may include at least one ground. According to an embodiment, the PCB 320 may include a plurality of conductive layers. In an example, the at least one ground may be formed on a first layer among the plurality of conductive layers of the PCB 320.

Referring to FIG. 3, the microphone module 330 according to an embodiment may be disposed on a certain area on the PCB 320. In an example, the microphone module 330 may be disposed at a certain point on the PCB 320 which is adjacent to the side surface 110C of the housing 110. For example, the microphone module 330 may be disposed at a certain point on the PCB 320 that is adjacent to the third side surface 1113 of the housing 110.

In other words, the microphone module 330 may be disposed at a certain point on the PCB that is adjacent to the third side surface 1113 formed on the upper end of the electronic device 101 in the side surface 110C of the housing 110.

According to an embodiment, a front-facing camera 309 and a receiver 308 may be disposed in an inner area of the electronic device 101 that is adjacent to the PCB 320 to face the front surface 110A of the electronic device 101, and the microphone module 330 may be disposed on the PCB 320 to face the rear surface 110B of the electronic device 101. According to an embodiment, the front-facing camera 309 may have a part exposed to the outside through the camera hole 103 formed on the front surface 110A of the electronic device 101. According to an embodiment, the receiver 308 may have a part exposed to the outside through the receiver hole 109 formed on the front surface 110A of the electronic device 101.

Figure 4:
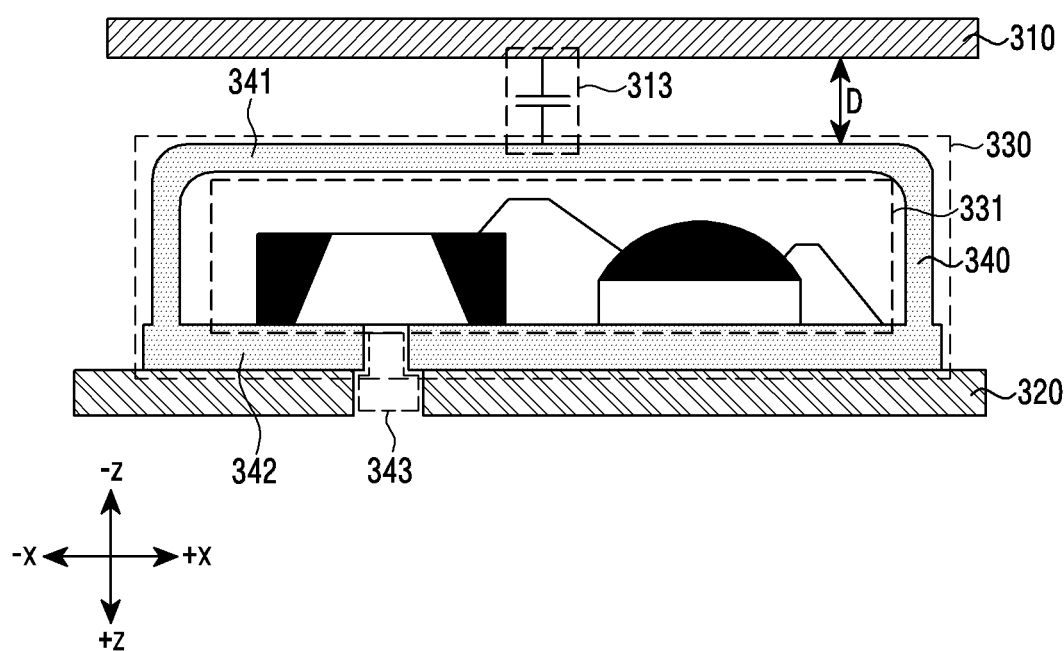
FIG. 4 is a diagram illustrating a cross section of the area A of FIG. 2 of the electronic device according to various embodiments.

FIG. 4 is a cross-sectional view illustrating of a part of the area A of FIG. 2 of the electronic device 101 according to various embodiments.

According to an embodiment, FIG. 4 illustrates the microphone module 330.

According to an embodiment, the microphone module 330 may include a microphone (for example, 331 of FIG. 4). According to an embodiment, an external sound may be input to the electronic device 101 through the microphone 331 of the microphone module 330.

According to an embodiment, the microphone module 330 may further include the microphone housing 340 to protect the microphone 331. According to an embodiment, the microphone housing 340 may be formed of a housing for covering the microphone 331.

According to an embodiment, the microphone module 330 may further include the microphone housing 340, thereby being protected from an external impact. In addition, the microphone module 330 may block an electrical noise which influence from an outside by the microphone housing 340.

Referring to FIG. 4, the microphone housing 340 according to an embodiment may include at least one hole 343.

According to an embodiment, the microphone housing 340 may include at least one hole 343 formed in a second direction (for example, +z direction) which is opposite to a first direction (for example, −z direction). For example, the at least one hole 343 may be formed on a second surface 342 which is opposite to a first surface 341 adjacent to the conductive member 310.

In other words, the at least one hole 343 may be formed on the second surface 342 of the housing 340 that is adjacent to the PCB 320.

According to an embodiment, the PCB 320 may include at least one hole. According to an embodiment, the at least one hole formed on the PCB 320 may be formed on the same area as the at least one hole 343 formed on the microphone housing 340.

According to an embodiment, the at least one hole 343 may be formed to allow a voice flowing from an outside to flow into the inside of the microphone module 330. In other words, a sound may be input to the microphone module 330 through the at least one hole 343. However, in various embodiments, the hole formed on the microphone module 330 may be formed on a surface that is not adjacent to the PCB 320. For example, the microphone module 330 may include at least one hole formed at an appropriate position which is connected with a sound duct for acquiring a voice, etc. of a user from the outside of the electronic device 101.

According to an embodiment, at least part of the microphone housing 340 may be formed with a conductive member (for example, a metal member). However, the material of the microphone housing 340 is not limited thereto. For example, a part of the microphone housing 340 may be formed with a nonconductive member.

According to an embodiment, the microphone housing 340 may be electrically connected with the PCB 320. In an example, the microphone housing 340 or a portion of the microphone housing 340 that is formed with a conductive member may be electrically connected with the ground of the PCB 320. In an embodiment, the microphone housing 340 may be electrically connected with the first layer on which the ground is formed among the plurality of layers of the PCB 320.

According to an embodiment, the microphone housing 340 may further include a ground electrically and directly connected with the microphone housing 340.

According to an embodiment, the conductive member 310 may be disposed on an area that is adjacent to the PCB 320. For example, the conductive member 310 may be disposed on an area that is adjacent to the microphone module 330 mounted on the PCB 320. In other words, the conductive member 310 may be disposed on an area that is adjacent to the microphone housing 340 mounted on the PCB 320.

According to an embodiment, the conductive member 310 may be disposed adjacent to a surface of the microphone housing 340. For example, the conductive member 310 may be disposed adjacent to the first surface 341 of the microphone housing 340.

According to an embodiment, the conductive member 310 may be disposed, spaced apart from the microphone housing 340 by a designated distance D or less. For example, the conductive member 310 may be disposed, spaced apart from the microphone housing 340 by a distance within 0.3 mm.

An example embodiment related to antenna radiation performance according to the spacing distance D between the microphone housing 340 and the conductive member 310 will be described in greater detail below with reference to FIG. 7.

According to an embodiment, at least part of the microphone housing 340 and the conductive member 310 may be disposed, spaced apart from each other, while overlapping each other in one direction. For example, referring to FIG. 4, the conductive member 310 may be disposed, spaced apart from at least part of the microphone housing 340 by a designated distance D (for example, 0.3 mm) or less while overlapping with reference to the first direction (for example, −z direction) in which the rear surface 110B of the electronic device 101 faces.

According to an embodiment, the conductive member 310 and the microphone housing 340 may be spaced apart from each other by the designated distance D or less, such that the conductive member 310 may be electrically coupled with the microphone housing 340 in terms of an RF frequency. According to an embodiment, the conductive member 310 and the at least part of the microphone housing 340 may be coupled, thereby forming an electrical path connecting the conductive member 310 and the ground. For example, the conductive member 310 and the microphone housing 340 may be adjacent to each other, such that there is an effect that the conductive member 310 is connected with the ground through a virtual capacitor 313 and the microphone housing 340.

According to an embodiment, the electronic device 101 may include an antenna carrier 350. According to an embodiment, the antenna carrier 350 may be formed with a nonconductive member.

According to an embodiment, the conductive member 310 may be used as an antenna radiator. According to an embodiment, the conductive member 310 may be disposed in the antenna carrier 350 which is formed with the nonconductive member. For example, the conductive member 310 may be disposed in a part of the antenna carrier 350. In an embodiment, the conductive member 310 may correspond to a metal frame antenna which uses a part of the housing. The conductive member 310 may be extended from a metal frame toward the microphone housing 340.

According to an embodiment, a part of the third side surface 1113 of the housing 110 may be formed of a conductive portion. According to an embodiment, the conductive member 310 may be electrically connected with the conductive portion of a part of the third side surface 1113 of the housing 110. According to an embodiment, the conductive member 310 may be electrically connected with the conductive portion of the third side surface 1113 of the housing 110, such that the electronic device 101 may transmit and/or receive a signal of a designated frequency band using the conductive portion of a part of the housing 110 as an electrical path, which will be described below.

According to an embodiment, the conductive member may correspond to a laser direct structuring (LDS) antenna. However, the shape of the conductive member is not limited thereto. For example, the conductive member may be formed as a metal frame antenna. The conductive member may be formed as a patch antenna.

According to an embodiment, an antenna including the conductive member may correspond to a diversity antenna. For example, the electronic device 101 may receive a signal of a designated frequency band through the diversity antenna.

According to an embodiment, the microphone housing 340 and the conductive member 310 are disposed, spaced apart from each other, such that the electronic device 101 may prevent and/or reduce a damage caused by a direct contact between the microphone housing 340 and the conductive member 310.

In an embodiment, the conductive member 310 and the microphone housing 340 may be electrically connected, such that the electronic device 101 may use the microphone housing 340 as an electrical path to receive an antenna signal. Accordingly, the electronic device 101 may transmit and/or receive a signal of a designated frequency without having to add an electrical connection member (for example, a c-clip).

In addition, an electrical connection member is excluded, such that the electronic device 101 may guarantee an additional space for mounting other electronic components.

According to an embodiment, a wireless communication circuit may be disposed on the PCB 320. According to an embodiment, the wireless communication circuit may feed the conductive member 310.

Referring to FIG. 3, according to an embodiment, the conductive member 310 may be connected with a plurality of feeding points on the PCB 320. For example, a plurality of electrical connection members (for example, a C-clip) may be formed on the PCB 320. According to an embodiment, the plurality of feeding points may correspond to the plurality of electrical connection members (for example, a C-clip).

According to an embodiment, the wireless communication circuit may feed the conductive member 310 through the plurality of electrical connection members. According to an embodiment, a first electrical connection member may be formed at a first point 311. In addition, according to an embodiment, a second electrical connection member may be formed at a second point 312. According to an embodiment, the first electrical connection member and the second electrical connection member may be distinguished from each other.

For example, the wireless communication circuit may feed the conductive member 310 at the first point 311 on the PCB 320. In addition, the wireless communication circuit may feed the conductive member 310 at the second point 312 which is adjacent to the first point 311. In other words, the wireless communication circuit may feed at the first point 311 and the second point 312 which is distinguished from the first point 311.

However, the feeding point formed on the PCB 320 is not limited thereto. For example, the feeding point may be formed of the first feeding point 311 as a single point. According to another example, the feeding point may further include an additional third point, in addition to the first point 311 and the second point 312.

According to an embodiment, the wireless communication circuit may transmit and/or receive a signal of a designated frequency band by feeding the conductive member 310. In an example, the wireless communication circuit may transmit and/or receive a signal of a first frequency band by feeding at the first point 311 of the PCB 320. In addition, the wireless communication circuit may transmit and/or receive a signal of a second frequency band by feeding at the second point 312 the PCB 320 which is distinguished from the first point 311.

Accordingly, the wireless communication circuit may transmit and/or receive a signal of a designated frequency band, based on the electrical path including the conductive member 310 and the microphone housing 340, which is coupled and electrically connected with the conductive member 310, by feeding the conductive member 310.

According to an embodiment, the first frequency band may correspond to a frequency of a first range. In addition, the second frequency band may correspond to a second range which is distinguished from the first frequency band.

According to an embodiment, the first range of the first frequency band may be larger than the second range of the second frequency band. For example, the first range may include a range from about 2,375 MHz to about 2,600 MHz. In addition, the second range may include a range from about 1,700 MHz to about 2,100 MHz. However, the range of the frequency band is not limited thereto.

According to an embodiment, the designated first frequency band may further include a frequency band from about 700 MHz to about 850 MHz.

In an embodiment, the wireless communication circuit may transmit and/or receive a signal of the first frequency band of a first size, based on the electrical path including the conductive member 310 and the microphone housing 340, which is electrically coupled and connected with the conductive member 310, by feeding at the first point of the conductive member 310.

In an embodiment, the wireless communication circuit may transmit and/or receive a signal of the second frequency band of a second size, based on the electrical path including the conductive member 310 and the microphone housing 340, which is coupled and electrically connected with the conductive member 310, by feeding at the second point 312 of the conductive member 310.

Figure 5:
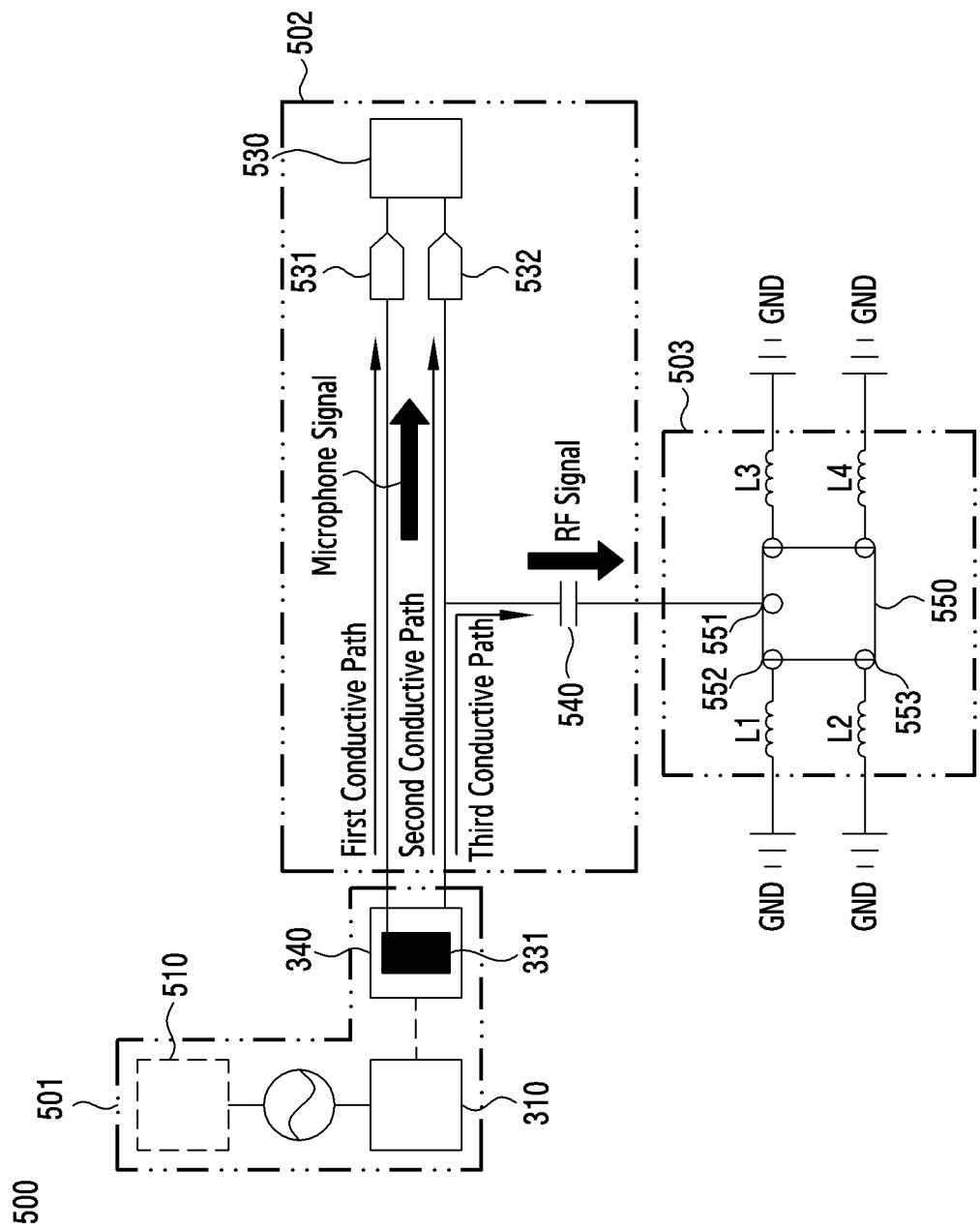
FIG. 5 is a diagram illustrating a communication circuit including a microphone housing of the electronic device according to various embodiments.

FIG. 5 is a diagram illustrating an example communication circuit 500 including the microphone housing 340 of the electronic device 101 according to various embodiments.

Referring to FIG. 5, according to an embodiment, the communication circuit 500 may refer to an electrical path connected with a wireless communication circuit 510 of the electronic device 101.

According to an embodiment, a first portion 501 may refer to an electrical path in which the wireless communication circuit 510 feeds power via the conductive member 310 and the microphone housing 340. As described above with reference to FIG. 3 or 4, the conductive member 310 according to an embodiment may be coupled and electrically connected with the microphone housing 340.

According to an embodiment, the wireless communication circuit 510 may transmit and/or receive a signal of a designated frequency band using the conductive member 310 and the microphone housing 340, by feeding at a certain point of the conductive member 310. In an example, the conductive member 310 may include antenna radiators of various shapes. For example, the conductive member 310 may include a patch antenna or a laser direct structuring (LDS) antenna.

According to an embodiment, a second portion 502 may refer to an electrical path which electrically connects between the microphone housing 340 and the microphone module 330. In an example, the microphone housing 340 may be electrically connected with a first terminal 531 and a second terminal 532. For example, the first terminal 531 may correspond to a (+) terminal (for example, a positive terminal) of a microphone. In addition, in an embodiment, the second terminal 532 may correspond to a (−) terminal (for example, a negative terminal) of the microphone.

According to an embodiment, a signal input through the first terminal 531 may be provided to the second terminal 532 through the microphone module 330.

In an embodiment, an application processor (AP) 530 may receive a voice signal transmitted from an outside of the electronic device 101 through the first terminal 531.

According to an embodiment, the second portion 502 of the communication circuit 500 may include a first conductive path which connects the first terminal 531 and the microphone 331, a second conductive path which connects the second terminal 532 and the microphone housing 340, and a third conductive path which connects the microphone housing 340 and a capacitor 540.

According to an embodiment, a voice signal transmitted from an outside of the electronic device 101 may be input to the AP 530 through the microphone 331, the first electrical path, and the first terminal 531.

In an example, the first conductive path and the second conductive path may be electrically separated from each other. In addition, in an embodiment, the second conductive path and the third conductive path may share at least part of the path.

According to an embodiment, the microphone housing 340 may be electrically connected with a ground through the third conductive path.

According to an embodiment, the capacitor 540 may be disposed on the third conductive path. Accordingly, the microphone housing 340 may be electrically connected with the capacitor 540 through the third conductive path. Alternatively, the microphone housing 340 may be electrically connected with the ground through the third conductive path in which the capacitor 540 is disposed.

According to an embodiment, a microphone signal may be formed of a low frequency signal, and an RF signal may be formed of a high frequency signal.

According to an embodiment, the capacitor 540 may substantially operate as an open circuit with respect to a low frequency signal. In addition, according to an embodiment, the capacitor 540 may be substantially formed as a short circuit with respect to a high frequency signal.

For example, an impedance of the capacitor 540 may become relatively smaller in a high frequency signal. According to an embodiment, the capacitor the impedance of which becomes relatively smaller may be eventually short-circuited and may operate as an open circuit. In addition, for example, the impedance of the capacitor 540 may become relatively higher in a low frequency signal. According to an embodiment, the capacitor the impedance of which becomes relatively higher may be eventually opened and may operate as an open circuit.

According to an embodiment, a microphone signal (low frequency signal) may be distinguished by the capacitor 540 disposed on the third conductive path. However, an RF signal (for example, a high frequency signal) may not be distinguished by the capacitor 540 and may be transmitted along the third conductive path.

According to an embodiment, the RF signal may not be distinguished by the capacitor 540, such that the wireless communication circuit 510 may transmit and/or receive a signal of a designated frequency band. Accordingly, the electronic device 101 may distinguish between a signal of a high frequency band and a signal of a low frequency band by the capacitor 540.

According to an embodiment, the capacitor 540 may be disposed in the second portion 502 of the communication circuit 500 of the electronic device 101, such that the electronic device 101 may use the microphone housing 340 as an electrical path. Accordingly, the electronic device 101 may transmit and/or receive a signal of a designated frequency band using an antenna including the microphone housing 340.

Referring to FIG. 5, the communication circuit 500 according to an embodiment may further include an impedance matching circuit. According to an embodiment, a third portion 503 of the communication circuit 500 may refer to the impedance matching circuit.

According to an embodiment, the electronic device 101 may further include a switching module 550. According to an embodiment, the switching module 550 may be electrically connected with the capacitor 540. According to an embodiment, a signal transmitted by the wireless communication circuit 510 may be input to the switching module 550 along the third electrical path by the capacitor 540.

TABLE 1

| Antenna reception sensitivity | First state [dB] | Second state [dB] |
| --- | --- | --- |
| First frequency band | −89.1 | −89.2 |
| Second frequency band | −94.1 | −93.8 |
| Third frequency band | −89.6 | −89.6 |
| Fourth frequency band | −89.2 | −89.3 |
| Fifth frequency band | −88.3 | −88.5 |

According to an embodiment, Table 1 shows reception sensitivity of an antenna in a first state in which the microphone 331 is not used, and a second state in which the capacitor 540 is used while the microphone 331 is used.

According to an embodiment, examples on the vertical axis of Table 1 are frequency bands. In addition, examples on the horizontal axis of Table 1 are the first state in which the microphone 331 is not used and the second state in which the microphone 331 is used.

According to an embodiment, the first state may refer to a state in which the microphone 331 is not used and only an RF signal is received. According to an embodiment, the second state may refer to a state in which the capacitor 540 is used along with the microphone 331 and a microphone signal and an RF signal are distinguished.

In other words, the first state may refer to a state in which the electronic device 101 transmits and/or receives a signal of a designated frequency band without using the capacitor 540 due to the nonuse of the microphone 331. In addition, the second state may refer to a state in which the electronic device 101 transmits and/or receives a signal of a designated frequency band while using the capacitor 540 due to the use of the microphone 331.

Referring to Table 1, when the capacitor 540 is used, the electronic device 101 using the microphone 331 may have substantially the same antenna reception sensitivity as that of the electronic device not using the microphone 331.

According to an embodiment, referring to Table 1, an antenna in the first state of the first frequency band may have reception sensitivity of −89.1. According to an embodiment, an antenna in the second state may have reception sensitivity of −89.2.

According to an embodiment, an antenna in the first state of the second frequency band may have reception sensitivity of −94.1. In addition, an antenna in the second state may have reception sensitivity of −93.8.

Referring to antenna reception sensitivity of the first frequency band, the second frequency band, the third frequency band, the fourth frequency band, and the fifth frequency band, reception sensitivity in the second state may be substantially the same as reception sensitivity in the first state.

Accordingly, the electronic device 101 which transmits and/or receives a signal based on the electrical path including the microphone housing 340 and the capacitor 540 may guarantee substantially the same radiation performance as the electronic device 101 which transmits and receives a signal using an antenna including an electrical connection member (for example, a c-clip) without using the capacitor 540.

According to an embodiment, the electronic device 101 may further include the switching module 550. For example, the electronic device 101 may further include the switching module 550 including at least one lumped element (for example, an inductor or a capacitor) for impedance matching.

According to an embodiment, the switching module 550 may include a plurality of inductors. For example, the switching module may include a first inductor L1, a second inductor L2, a third inductor L3, and/or a fourth inductor L4. According to an embodiment, the first inductor L1, the second inductor L2, the third inductor L3, and/or the fourth inductor L4 may have different inductance values.

According to an embodiment, the third electrical path may have various electrical lengths due to the switching module 550. In an example, when a first port 551 of the switching module 550 is connected with a second port 552, the electrical length of the third electrical path may be shortened due to the first inductor L1 having a low inductance value.

According to an embodiment, when the first port 551 of the switching module 550 is connected with a third port 553, the electrical length of the third electrical path may be elongated due to the second inductor L2 having an inductance value higher than the first inductor L1.

According to an embodiment, the first port 551 and the second port 552 of the switching module 550 may be electrically connected, such that the wireless communication circuit 510 may be grounded through the first inductor L1.

According to an embodiment, the first port 551 and the third port 553 of the switching module 550 may be electrically connected, such that the wireless communication circuit 510 may be grounded through the third inductor L3.

According to an embodiment, the switching module 550 may include the plurality of inductors having different inductance values, such that the wireless communication circuit 510 of the electronic device 101 may transmit and/or receive signals of various frequency bands.

However, the lumped element included in the third portion 503 of the communication circuit 500 is not limited to the configuration illustrated in FIG. 5. For example, the third portion 503 may include a combination of other additional lumped elements.

According to an embodiment, the wireless communication circuit 510 in the electronic device 101 may control the switching module 550. For example, the wireless communication circuit 510 may control the switching module 550 to perform impedance matching in response to the designated frequency band.

Figure 6:
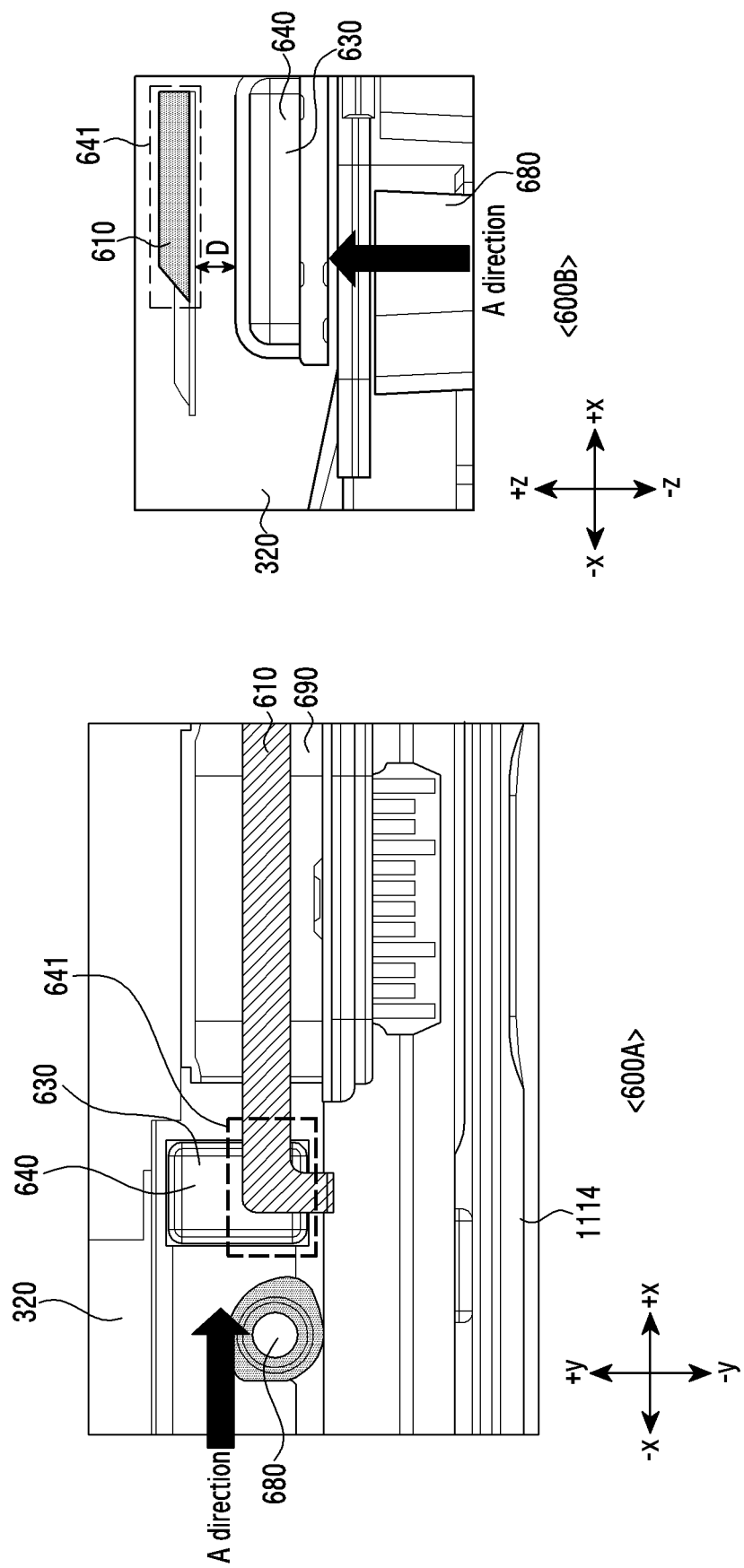
FIG. 6 is a diagram illustrating the area B of the electronic device of FIG. 1 according to various embodiments.

FIG. 6 includes diagrams illustrating the area B of the electronic device 101 of FIG. 1 according to various embodiments.

According to an embodiment, FIG. 6 includes diagrams illustrating an antenna including a microphone housing 640 positioned on the fourth side surface 1114 of the electronic device 101.

According to an embodiment, 600A of FIG. 6 is a view illustrating a front surface of a USB connector 690 and the microphone housing 640 of the electronic device 101. 600B of FIG. 6 is a view illustrating a side surface of the microphone housing 640 when the microphone housing 640 is viewed from the A direction.

According to an embodiment, the electronic device 101 may include a microphone module 630 and the universal serial bus (USB) connector 690.

Regarding the microphone module 630 of FIG. 6 according to an embodiment, references may be made to the microphone module 330 of FIG. 3. For example, regarding an electrical connection relationship among the microphone module 630 and the microphone housing 640 of FIG. 6 and the PCB 320, reference may be made to the electrical connection relationship among the microphone module 330, the microphone housing 340, and the PCB 320 of FIG. 3.

Referring to 600A of FIG. 6, the USB connector 690 according to an embodiment may be disposed on the side surface 110C of the housing 110. For example, the USB connector 690 may be disposed on the fourth side surface 1114 of the housing 110. The fourth side surface 1114 of the housing 110 may correspond to a lower end periphery of the electronic device 101.

According to an embodiment, the microphone housing 640 may be disposed on the side surface 110C of the housing 110. For example, the microphone housing 640 may be disposed on the fourth side surface 1114 of the housing 110. According to an embodiment, the microphone housing 640 may be disposed on a certain area on the PCB 320 that is adjacent to the USB connector 690. For example, the microphone housing 640 may be disposed on a certain area that is adjacent to a side surface facing in a first direction (for example, −x direction) with reference to the USB connector 690. In an embodiment, the microphone housing 640 may be disposed on a certain area between a coupling member 680 for fixing the PCB 320 and the USB connector 690.

According to an embodiment, the electronic device 101 may further include a conductive member 610. According to an embodiment, the conductive member 610 may be disposed adjacent to the microphone housing 640. In an example, the conductive member 610 may be disposed to overlap a part of the microphone housing 640 when viewed from one direction. For example, the conductive member 610 may be formed to overlap at least part of the microphone housing 640 with reference to a first direction (for example, +z direction or −z direction).

In other words, the conductive member 610 may be formed to overlap at least part of the microphone housing 640 with reference to a direction (for example, +z direction) in which the front surface 110A of the electronic device 101 faces. The conductive member 610 may be formed to overlap at least part of the microphone housing 640 with reference to a direction (for example, −z direction) in which the rear surface 110B of the electronic device 101 faces.

Referring to 600B of FIG. 6, the conductive member 610 according to an embodiment may be disposed in a first area 641 which is spaced apart from a front surface of the microphone housing 640 by a designated distance D or less. For example, the designated distance D may be within 0.3 mm, but this should not be considered as limiting.

According to an embodiment, the conductive member 610 may be spaced apart from the front surface of the microphone housing 640 by the designated distance D or less, such that the conductive member 610 may be coupled with the microphone housing 640 and may be electrically connected.

Regarding an electrical connection relationship between the microphone housing 640 and the conductive member 610 according to an embodiment, reference may be made to the embodiment of the microphone housing 340 and the conductive member 310 of FIGS. 3, 4, and 5.

According to an embodiment, the conductive member 610 may be extended from a certain area on the PCB 320 to the first area 641 which is spaced apart from the surface of the microphone housing 640. In an example, the conductive member 610 may be extended from a certain area on the PCB 320 to the first area 641 in the first direction (for example, +z direction). According to an embodiment, the conductive member 610 extended to the first area 641 may be bent in the first area 641 and may be extended in parallel with the surface of the microphone housing 640. For example, the conductive member 610 may be extended in a second direction (for example, +y direction) perpendicular to the first direction.

According to an embodiment, the conductive member 610 may be extended in a direction parallel to the surface of the microphone housing 640 or in the second direction (for example, +y direction), such that the conductive member 610 overlaps a part of the microphone housing 640 with reference to the first direction (for example, +z direction or −z direction).

According to an embodiment, the conductive member 610 may be extended in a third direction (for example, +x direction) perpendicular to the first direction (for example, the +z direction or −z direction), or in the A direction in the first area 641.

According to an embodiment, the conductive member 610 may be extended from the side surface 110C of the housing 110. In an example, the conductive member 610 may be extended from the fourth side surface 1114 of the housing 110.

According to an embodiment, a part of the fourth side surface 1114 of the housing 110 may be formed as a conductive portion. According to an embodiment, the conductive member 610 may be electrically connected with the conductive portion of a part of the fourth side surface 1114 of the housing 110. According to an embodiment, the conductive member 610 may be electrically connected with the conductive portion of the fourth side surface 1114 of the housing 110, and may be extended to the first area 641, such that the electronic device 101 may transmit and/or receive a signal of a designated frequency band using a part of the housing 110 and the conductive member 610.

According to an embodiment, the conductive member 610 and/or the conductive portion of a part of the housing 110 may be used as an antenna radiator of the electronic device 101.

For example, the electronic device 101 may include an antenna carrier. According to an embodiment, the antenna carrier may be formed with a nonconductive member.

According to an embodiment, the conductive member 610 may be disposed in the antenna carrier formed with the nonconductive member. For example, the conductive member 610 may be disposed in a part of the antenna carrier.

According to an embodiment, the wireless communication circuit may transmit and/or receive an RF signal using the conductive member 610 and the microphone housing 640. For example, the wireless communication circuit may transmit and/or receive a signal of a designated frequency band, based on an electrical path including the conductive member 610 and the microphone housing 64, by feeding the conductive member 610 or grounding.

According to an embodiment, the wireless communication circuit may transmit and/or receive a signal of a designated frequency band, based on the electrical path including the conductive member 610 and the microphone housing 640, by feeding the conductive member 610.

According to an embodiment, the wireless communication circuit may transmit and/or receive a signal of a designated frequency band (for example, a range from 2,350 MHz to 2,600 MHz), based on the electrical path further including the conductive portion of the side surface 110C of the housing 110, by feeding the conductive member 610.

According to an embodiment, the wireless communication circuit may use the microphone housing 640 as an electrical path, such that the electronic device 101 may transmit and/or receive a signal of a designated frequency band without using an electrical connection member (for example, a c-clip).

According to an embodiment, the microphone housing 640 and the conductive member 610 may be disposed, spaced apart from each other by the designated distance D, such that the electronic device 101 may prevent and/or reduce a direct contact between the microphone housing 640 and the conductive member. The direct contact may be prevented/reduced, such that the microphone housing 640 may be prevented and/or reduced from being broken by an external impact (for example, an impact with the conductive member 610).

Figure 7:
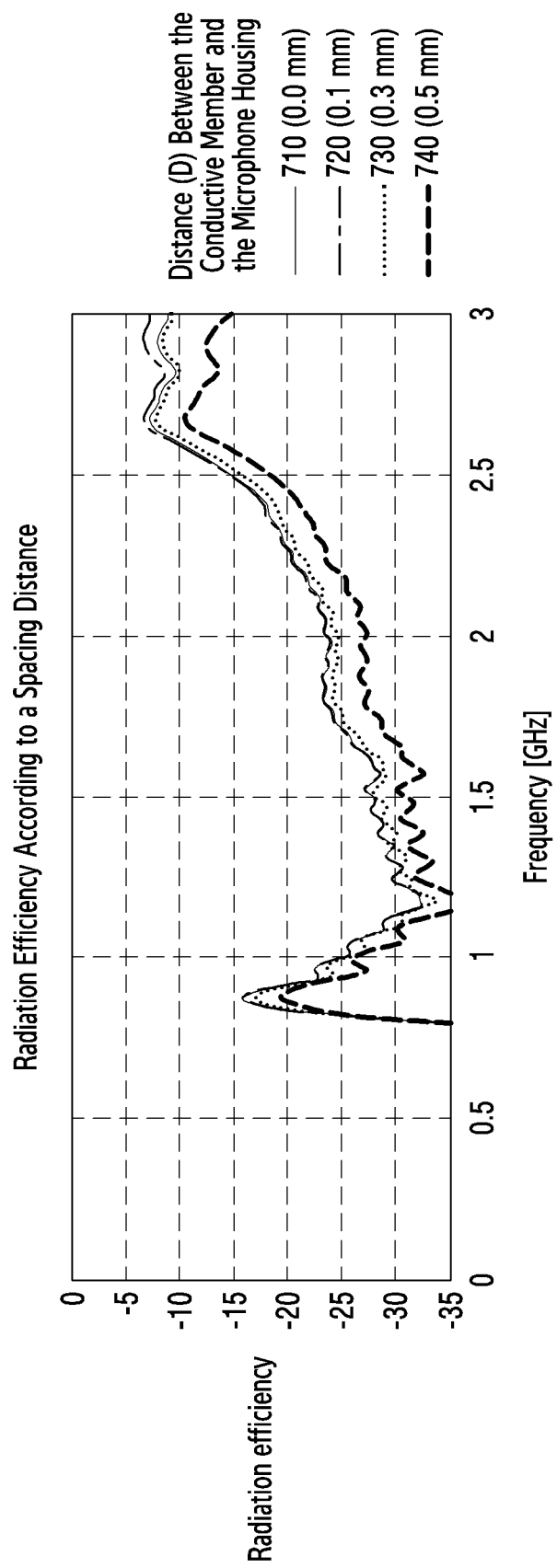
FIG. 7 is a graph illustrating a comparison of radiation efficiency according to a designated distance between a microphone housing and a conductive member according to various embodiments.

FIG. 7 is a graph illustrating a comparison of radiation efficiency according to a designated distance D between the microphone housing 340 and the conductive member 310 according to an embodiment.

According to an embodiment, FIG. 7 illustrates radiation efficiency appearing when the microphone housing 340 and the conductive member 310 are spaced apart from each other by a designated distance D or less and are coupled. According to an embodiment, the X axis of the graph of FIG. 7 indicates a frequency [GHz]. According to an embodiment, the Y axis of the graph of FIG. 7 indicates radiation efficiency.

Referring to FIG. 7, a first graph 710 of FIG. 7 shows antenna radiation efficiency when the microphone housing 340 and the conductive member 310 contact each other. A second graph 720 of FIG. 7 shows antenna radiation efficiency when the designated distance D between the microphone housing 340 and the conductive member 310 is 0.1 mm. A third graph 730 of FIG. 7 shows antenna radiation efficiency when the designated distance D between the microphone housing 340 and the conductive member 310 is 0.3 mm. A fourth graph 740 of FIG. 7 shows antenna radiation efficiency when the designated distance D between the microphone housing 340 and the conductive member 310 is 0.5 mm. Referring to FIG. 7, the first graph 710, the second graph 720, and the third graph 730 according to an embodiment show substantially the same radiation efficiency. In an embodiment, the fourth graph 740 shows radiation efficiency lower than the third graph 730.

According to an embodiment, when the distance D between the microphone housing 340 and the conductive member 310 is within 0.3 mm, an antenna of the electronic device 101 may have first radiation efficiency which is substantially the same as an antenna electrically connected as the conductive member 310 and the microphone housing 340 are in contact with each other.

However, when the designated distance D between the microphone housing 340 and the conductive member 310 is 0.5 mm, the antenna of the electronic device 101 may have second radiation efficiency lower than the first radiation efficiency.

According to an embodiment, when the distance D between the microphone housing 340 and the conductive member 310 is within 0.3 mm, the antenna of the electronic device 101 may have efficiency which is substantially the same as the antenna electrically connected as the conductive member 310 and the microphone housing 340 are in contact with each other.

Accordingly, referring to the graph of FIG. 7, when the designated distance D between the microphone housing 340 and the conductive member 310 is within 0.3 mm according to an embodiment, the radiation performance of the antenna of the electronic device 101 may not be degraded.

Figure 8:
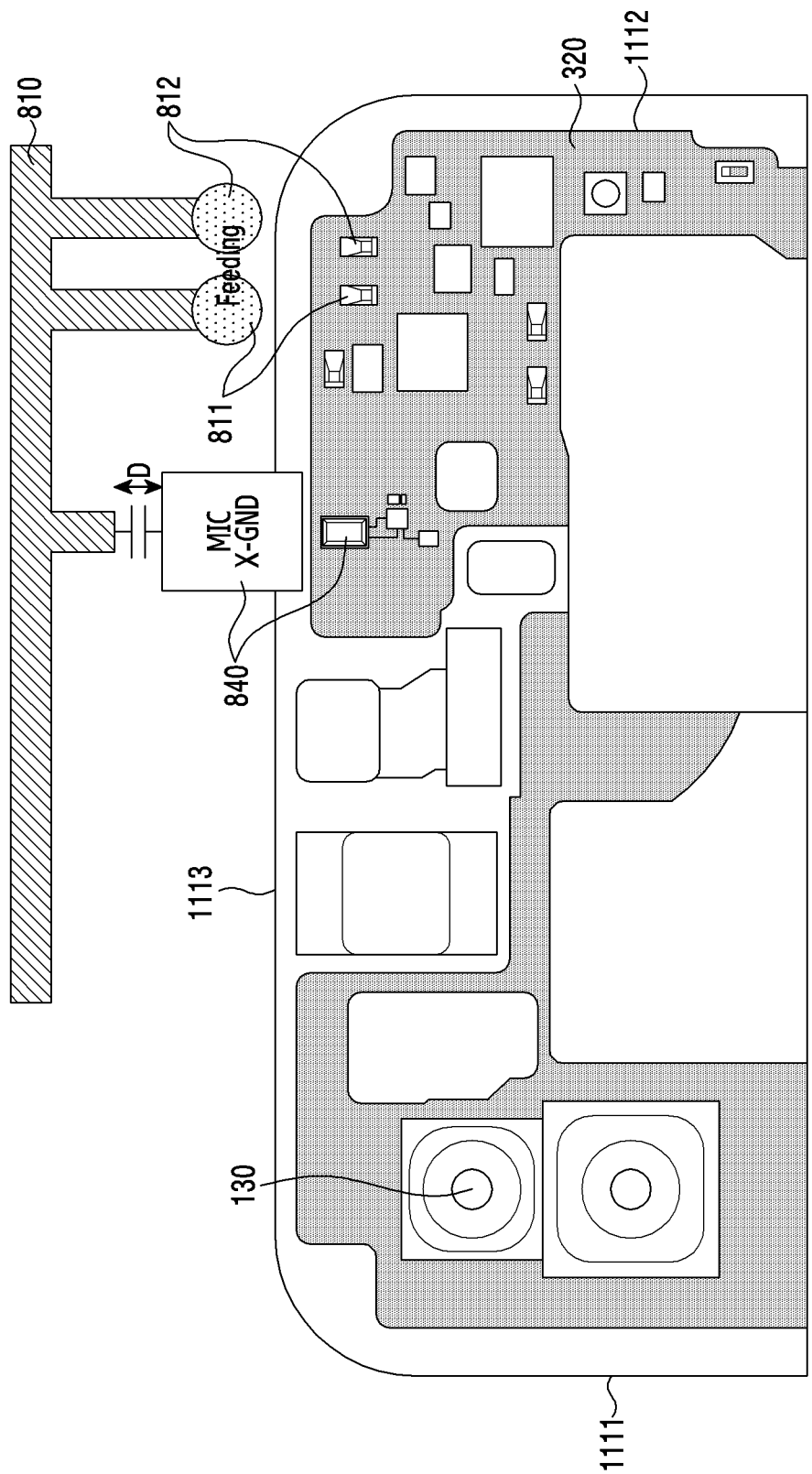
FIG. 8 is a diagram illustrating the area A of the electronic device according to various embodiments.

FIG. 8 is a diagram illustrating the area A of the electronic device 101 according to various embodiments.

According to an embodiment, FIG. 8 is a view illustrating an embodiment in which the electronic device 101 transmits and/or receives a signal of a designated frequency band using a conductive member 810 of the housing 110 of the electronic device 101.

Regarding FIG. 8, a description of components which are the same as or similar to those described in FIGS. 3, 4, and 5 may not be repeated.

According to an embodiment, referring to FIG. 8, the electronic device 101 may include a microphone housing 840 disposed on the PCB 320, a wireless communication circuit, and a conductive member 810 electrically connected with the PCB 320.

Regarding the conductive member 810 and the microphone housing 840 of FIG. 8 according to an embodiment, reference may be made to the conductive member 310 and the microphone housing 340 of FIGS. 3, 4, and 5. For example, the conductive member 810 may be coupled and electrically connected with the microphone housing 840. According to an embodiment, the microphone housing 840 may be electrically connected with the ground of the PCB 320.

According to an embodiment, the conductive member 810 may include a first point 811, and a second point 812 which is distinguished from the first point 811. According to an embodiment, the wireless communication circuit may transmit and/or receive a signal of a first frequency band by feeding at the first point 811. According to an embodiment, the wireless communication circuit may transmit and/or receive a signal of a second frequency band by feeding at the second point 812.

According to an embodiment, the housing 110 may form an inner space of the electronic device 101. According to an embodiment, a part of the housing 810 may be formed of the conductive member 810. In an example, the side surface 110C of the housing 110 may be formed of the conductive member 810. For example, referring to FIG. 8, a part of the third side surface 1113 of the housing 110 may be formed of the conductive member 810. In addition, a part of the third side surface 1113 of the housing 110 may be formed of a nonconductive member (for example, a segment portion).

According to an embodiment, the microphone housing 840 may be formed on a certain area on the PCB 320 that is adjacent to the side surface 110C of the housing 110. For example, the microphone housing 840 may be formed on a certain area on the PCB 320 that is adjacent to the conductive member 810 of the third side surface 1113 of the housing 110.

According to an embodiment, the conductive member 810 may be formed to overlap the microphone housing 840 with reference to one direction. For example, the conductive member 810 may be formed to overlap the microphone housing 840 when viewed with reference to a second direction (for example, +y direction) perpendicular to a first direction (for example, −z direction) in which the rear surface 110B of the electronic device 101 faces.

According to an embodiment, the microphone housing 840 may be disposed, spaced apart from the conductive member 810 by a designated distance D or less. For example, the microphone housing 840 may be disposed, spaced apart from the conductive member 810 by the designated distance D within 0.3 mm.

Accordingly, the conductive member 810 may be disposed, spaced apart from a surface of the microphone housing 840 by the designated distance D or less, while overlapping at least part of the microphone housing 840 with reference to the second direction (for example, +y direction) perpendicular to the first direction (for example, −z direction) in which the rear surface 110B of the electronic device 101 faces.

According to an embodiment, the microphone housing 840 and the conductive member 810 may be disposed, spaced apart from each other by the designated distance D or less, such that the microphone housing 840 and the conductive member 810 may be coupled and electrically connected.

According to an embodiment, the microphone housing 840 may be electrically connected with the ground through a conductive path. In addition, the electronic device 101 may further include a capacitor disposed on the conductive path.

Regarding the capacitor according to an embodiment, reference may be made to the capacitor 540 of FIG. 5.

According to an embodiment, the wireless communication circuit of the electronic device 101 may transmit and/or receive a signal of a designated frequency band by feeding the conductive member 810 formed on a part of the housing 110.

For example, the wireless communication circuit may transmit and/or receive a signal of a designated frequency band, based on the electrical path including the conductive member 810 and the microphone housing 840, by feeding the conductive member 810 formed on a part of the housing 110.

According to an embodiment, the designated frequency may include a frequency band within a range from 700 MHz to 850 MHz. The designated frequency may include a frequency band within a range from 1700 MHz to 2100 MHz, or may include a frequency band within a range from 2375 MHz to 2600 MHz.

According to an embodiment, the microphone housing 840 and the conducive member 810 may be coupled and electrically connected, such that the electronic device 101 may transmit and/or receive a signal of a designated frequency band without adding an electrical connection member (for example, a c-clip).

According to an embodiment, the electrical connection member is excluded, such that the electronic device 101 may guarantee an additional mounting space in the inner space of the electronic device 101.

Figure 9:
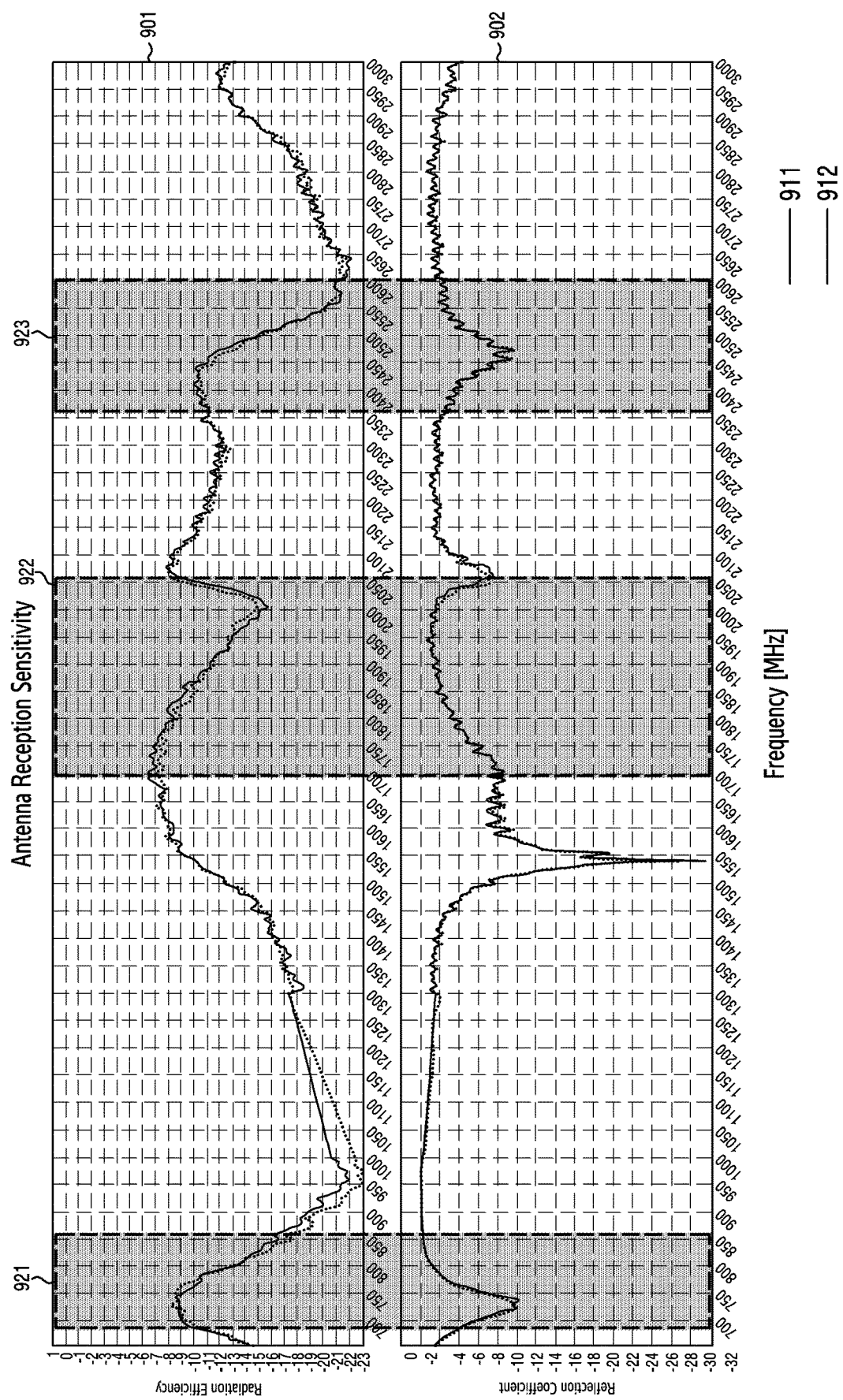
FIG. 9 is a graph illustrating a comparison of reception sensitivity of an antenna of the electronic device according to various embodiments.

FIG. 9 is a graph illustrating a comparison of reception sensitivity of an antenna of the electronic device 101 according to various embodiments.

According to an embodiment, Table 2 illustrates comparison of radiation efficiency of an antenna including an electrical connection member (for example, a c-clip) and an antenna including the microphone housing 340, 840.

A first graph 901 of FIG. 9 is a graph showing radiation efficiency of an antenna according to a frequency band, and a second graph 902 is a graph showing reflection efficiency according to a frequency band.

According to an embodiment, the y-axis of the first graph 901 indicates radiation efficiency of the antenna. In addition, the y-axis of the second graph 902 indicates a reflection coefficient of the antenna. According to an embodiment, the x-axis of the first graph 901 and the second graph 902 indicates a frequency [MHz].

According to an embodiment, referring to the first graph 901, a graph 911 shows radiation efficiency of the antenna including the electrical connection member (for example, a c-clip). According to an embodiment, a graph 912 shows radiation efficiency of the antenna including the microphone housing 340, 840.

According to an embodiment, a first frequency band 921 of the graph of FIG. 9 may include a frequency band within a range from 700 MHz to 850 MHz. According to an embodiment, a second frequency band 922 of the graph of FIG. 9 may include a frequency band within a range from about 1,700 MHz to about 2,100 MHz. A third frequency band 923 of the graph of FIG. 9 may include a frequency band within a range from about 2,375 MHz to about 2,600 MHz.

According to an embodiment, referring to the graph of FIG. 9, the antenna including the electrical connection member (graph 911) and the antenna including the microphone housing (graph 912) may have substantially the same radiation efficiency.

In an example, referring to the graph of FIG. 9, the antenna including the electrical connection member (graph 911) and the antenna including the microphone housing 340 (graph 912) may have substantially the same radiation efficiency in the first frequency band 921, the second frequency band 922, the third frequency band 923.

In an example, referring to the second graph 912, the antenna including the electrical connection member (graph 911) and the antenna including the microphone housing 340, 840 (graph 912) may have substantially the same reflection coefficient in the first frequency band 921, the second frequency band 922, the third frequency band 923.

According to an embodiment, instead of the antenna including the electrical connection member (graph 911), the antenna including the microphone housing 340, 840 (graph 912) may have substantially the same radiation efficiency and the same reflection coefficient as the antenna including the electrical connection member.

Accordingly, when the electronic device 101 transmits and/or receives a signal of a designated frequency band using the microphone housing 840 as an electrical path, radiation performance of the antenna of the electronic device 101 may not be degraded.

Table 2 shows reception sensitivity of the antenna including the electrical connection member (for example, a c-clip) and the antenna including the microphone housing 340, 840.

Referring to Table 2, the antenna including the electrical connection member and the antenna including the microphone housing may have substantially the same reception sensitivity.

TABLE 2

| Antenna reception sensitivity | Antenna including the electrical connection member [dB] | Antenna including the microphone housing [dB] |
|---|---|---|
| First frequency band | −92.3 | −92.5 |
| Second frequency band | −93.4 | −93.3 |
| Third frequency band | −91.2 | −90.9 |
| Fourth frequency band | −89.4 | −89.8 |
| Fifth frequency band | −91.6 | −91.7 |

According to an embodiment, in the first frequency band, the antenna including the electrical connection member may have reception sensitivity of −92.3, and the antenna including the microphone housing 340, 840 may have reception sensitivity of −92.5. In addition, in the second frequency band, the antenna including the electrical connection member may have reception sensitivity of −93.4, and the antenna including the microphone housing 340, 840 may have reception sensitivity of −93.3.

Comparing the first frequency band, the second frequency band, the third frequency band, the fourth frequency band, and the fifth frequency band of Table 2, the antenna including the electrical connection member and the antenna including the microphone housing 340, 840 may have substantially the same antenna reception sensitivity.

Accordingly, when the electronic device 101 transmits and/or receives a signal of a designated frequency band using the microphone housing 340, 840 as an electrical path, radiation performance of the antenna of the electronic device 101 may not be degraded.

Figure 10:
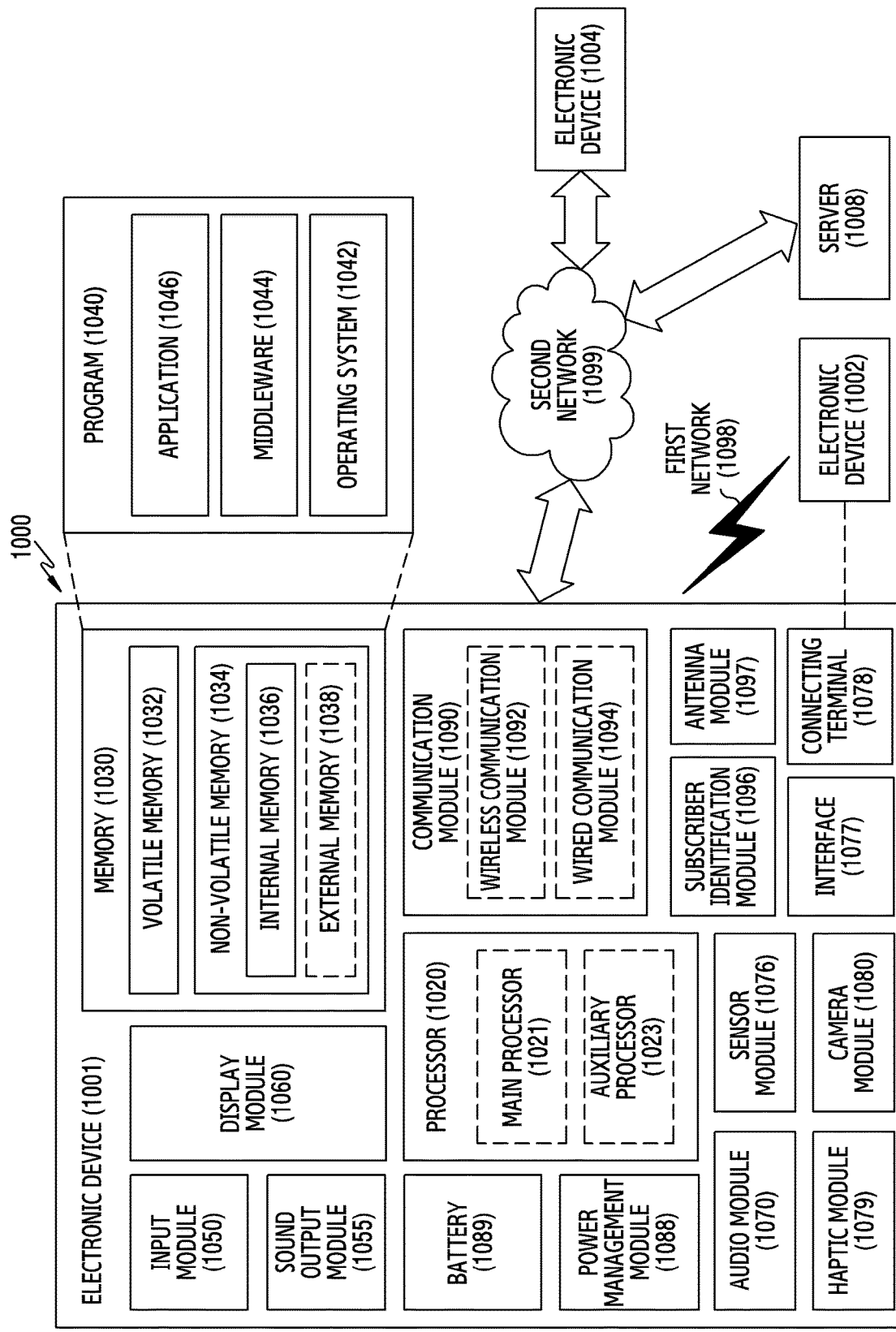
FIG. 10 is a block diagram illustrating an example electronic device in a network environment according to various embodiments.

FIG. 10 is a block diagram illustrating an example electronic device 1001 in a network environment 1000 according to various embodiments. Referring to FIG. 10, the electronic device 1001 in the network environment 1000 may communicate with an electronic device 1002 via a first network 1098 (e.g., a short-range wireless communication network), or at least one of an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input module 1050, a sound output module 1055, a display module 1060, an audio module 1070, a sensor module 1076, an interface 1077, a connecting terminal 1078, a haptic module 1079, a camera module 1080, a power management module 1088, a battery 1089, a communication module 1090, a subscriber identification module (SIM) 1096, or an antenna module 1097. In various embodiments, at least one of the components (e.g., the connecting terminal 1078) may be omitted from the electronic device 1001, or one or more other components may be added in the electronic device 1001. In various embodiments, some of the components (e.g., the sensor module 1076, the camera module 1080, or the antenna module 1097) may be implemented as a single component (e.g., the display module 1060).

The processor 1020 may execute, for example, software (e.g., a program 1040) to control at least one other component (e.g., a hardware or software component) of the electronic device 1001 coupled with the processor 1020, and may perform various data processing or computation. According to an embodiment, as at least part of the data processing or computation, the processor 1020 may store a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), or an auxiliary processor 1023 (e.g., a graphics processing unit (GPU), a neural processing unit (NPU), an image signal processor (ISP), a sensor hub processor, or a communication processor (CP)) that is operable independently from, or in conjunction with, the main processor 1021. For example, when the electronic device 1001 includes the main processor 1021 and the auxiliary processor 1023, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display module 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. According to an embodiment, the auxiliary processor 1023 (e.g., the neural processing unit) may include a hardware structure specified for artificial intelligence model processing. An artificial intelligence model may be generated by machine learning. Such learning may be performed, e.g., by the electronic device 1001 where the artificial intelligence is performed or via a separate server (e.g., the server 1008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input module 1050 may receive a command or data to be used by another component (e.g., the processor 1020) of the electronic device 1001, from the outside (e.g., a user) of the electronic device 1001. The input module 1050 may include, for example, a microphone, a mouse, a keyboard, a key (e.g., a button), or a digital pen (e.g., a stylus pen).

The sound output module 1055 may output sound signals to the outside of the electronic device 1001. The sound output module 1055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1060 may visually provide information to the outside (e.g., a user) of the electronic device 1001. The display module 1060 may include, for example, a display, a hologram device, or a projector and control circuitry to control a corresponding one of the display, hologram device, and projector. According to an embodiment, the display module 1060 may include a touch sensor adapted to detect a touch, or a pressure sensor adapted to measure the intensity of force incurred by the touch.

The audio module 1070 may convert a sound into an electrical signal and vice versa. According to an embodiment, the audio module 1070 may obtain the sound via the input module 1050, or output the sound via the sound output module 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The wireless communication module 1092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1092 may support a high-frequency band (e.g., the mmWave band) to achieve, e.g., a high data transmission rate. The wireless communication module 1092 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1092 may support various requirements specified in the electronic device 1001, an external electronic device (e.g., the electronic device 1004), or a network system (e.g., the second network 1099). According to an embodiment, the wireless communication module 1092 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1097 may transmit or receive a signal or power to or from the outside (e.g., the external electronic device) of the electronic device 1001. According to an embodiment, the antenna module 1097 may include an antenna including a radiating element including a conductive material or a conductive pattern formed in or on a substrate (e.g., a printed circuit board (PCB)). According to an embodiment, the antenna module 1097 may include a plurality of antennas (e.g., array antennas). In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

According to various embodiments, the antenna module 1097 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 or 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, mobile edge computing (MEC), or client-server computing technology may be used, for example. The electronic device 1001 may provide ultra low-latency services using, e.g., distributed computing or mobile edge computing. In an embodiment, the external electronic device 1004 may include an internet-of-things (IoT) device. The server 1008 may be an intelligent server using machine learning and/or a neural network. According to an embodiment, the external electronic device 1004 or the server 1008 may be included in the second network 1099. The electronic device 1001 may be applied to intelligent services (e.g., smart home, smart city, smart car, or healthcare) based on 5G communication technology or IoT-related technology.

According to various example embodiments, an electronic device may include: a housing forming an inner space of the electronic device; a printed circuit board (PCB) disposed in the inner space and including a ground; a microphone module including a microphone housing disposed at a point on the PCB adjacent to a side surface of the housing, the microphone housing being electrically connected with the ground; a conductive member comprising a conductive material disposed, spaced apart from a surface of the microphone housing by a specified distance or less, and overlapping at least part of the microphone housing with reference to a first direction in which a rear surface of the electronic device faces, the conductive member being coupled and electrically connected with the microphone housing; and a wireless communication circuit disposed on the PCB, wherein the wireless communication circuit may be configured to transmit and/or receive a signal of a designated frequency band, based on an electrical path including the conductive member and the microphone housing, by feeding the conductive member.

According to an example embodiment, the specified distance may be within 0.3 mm.

According to an example embodiment, the conductive member may correspond to a laser direct structuring (LDS) antenna.

According to an example embodiment, a conductive portion corresponding a part of the housing may be electrically connected with the conductive member, and the wireless communication circuit may be configured to transmit and/or receive a signal of a designated frequency band, based on the electrical path further including the conductive portion, by feeding the conductive portion of the housing.

According to an example embodiment, the wireless communication circuit may be configured to transmit and/or receive a signal of a first frequency band by feeding at a first point of the conductive member, and the wireless communication circuit may be configured to transmit and/or receive a signal of a second frequency band by feeding at a second point of the conductive member, different from the first point.

According to an example embodiment, the first frequency band may have a frequency band of a first size, and the second frequency band may have a second frequency band having a second size smaller than the first size.

According to an example embodiment, the microphone housing may be electrically connected with the ground through a conductive path, and the electronic device may further include a capacitor disposed on the conductive path.

According to an example embodiment, the microphone module may be disposed at a point on the PCB adjacent to a first side surface formed on an upper end of the electronic device among side surfaces of the housing.

According to an example embodiment, the conductive member may be configured to operate as a diversity antenna.

According to an example embodiment, the PCB may include a plurality of conductive layers, and the ground may be formed on a first layer among the plurality of conductive layers of the PCB.

According to an example embodiment, the electronic device may further include a switching module comprising a switch and including at least one lumped element electrically connected with the microphone housing.

According to an example embodiment, the wireless communication circuit may be configured to control the switching module to perform impedance matching in response to the designated frequency band.

According to an example embodiment, the microphone housing may include at least one hole formed inside the microphone housing facing a second direction opposite to the first direction, wherein a sound may be input to the microphone module through the at least one hole.

According to an example embodiment, the electronic device may further include a universal serial bus (USB) connector disposed on the side surface of the housing, and the microphone housing may be disposed adjacent to the USB connector.

According to an example embodiment, the specified frequency band may include a frequency band within a range of 2,375 MHz to 2,600 MHz.

According to various example embodiments, an electronic device may include: a housing forming an inner space of the electronic device, a part of the housing comprising a conductive member comprising a conductive material; a printed circuit board (PCB) disposed in the inner space and including a ground; a microphone module including a microphone housing disposed at a point on the PCB adjacent to a side surface of the housing, the microphone housing being electrically connected with the ground; and a wireless communication circuit disposed on the PCB, wherein the conductive member may be disposed, spaced apart from a surface of the microphone housing by a specified distance or less, and overlapping at least part of the microphone housing with reference to a second direction perpendicular to a first direction in which a rear surface of the electronic device faces, the conductive member and the microphone housing may be coupled and electrically connected, the wireless communication circuit may be configured to transmit and/or receive a signal of a designated frequency band, based on an electrical path including the conductive member and the microphone housing, by feeding the conductive member.

According to an example embodiment, the designated distance may be within 0.3 mm.

According to an example embodiment, the wireless communication circuit may be configured to transmit and/or receive a signal of a first frequency band by feeding at a first point of the conductive member, and may be configured to transmit and/or receive a signal of a second frequency band by feeding at a second point of the conductive member, which is distinguished from the first point.

According to an example embodiment, the first frequency band may have a frequency band of a first size, and the second frequency band may have a second frequency band of a second size smaller than the first size.

According to an example embodiment, the microphone housing may be electrically connected with the ground through a conductive path, and the electronic device may further include a capacitor disposed on the conductive path.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a housing forming an inner space of the electronic device;
   a printed circuit board (PCB) disposed in the inner space and including a ground;
   a microphone module comprising a microphone housing disposed at a point on the PCB adjacent to a side surface of the housing, the microphone housing being electrically connected with the ground;
   a conductive member comprising a conductive material disposed, spaced apart from a surface of the microphone housing by a specified distance or less, and overlapping at least part of the microphone housing with reference to a first direction in which a rear surface of the electronic device faces, the conductive member being coupled and electrically connected with the microphone housing; and
   a wireless communication circuit disposed on the PCB, wherein the wireless communication circuit is configured to transmit and/or receive a signal of a specified frequency band, based on an electrical path comprising the conductive member and the microphone housing, by feeding the conductive member.

2. The electronic device of claim 1, wherein the specified distance is within 0.3 mm.

3. The electronic device of claim 1, wherein the conductive member comprises a laser direct structuring (LDS) antenna.

4. The electronic device of claim 1, wherein a conductive portion corresponding to a part of the housing is electrically connected with the conductive member, and
wherein the wireless communication circuit is configured to transmit and/or receive a signal of a specified frequency band, based on the electrical path further comprising the conductive portion, by feeding at the conductive portion of the housing.

5. The electronic device of claim 1, wherein the wireless communication circuit is configured to transmit and/or receive a signal of a first frequency band by feeding at a first point of the conductive member, and
wherein the wireless communication circuit is configured to transmit and/or receive a signal of a second frequency band by feeding at a second point of the conductive member, different from the first point.

6. The electronic device of claim 5, wherein the first frequency band has a frequency band of a first size, and
wherein the second frequency band has a second frequency band of a second size smaller than the first size.

7. The electronic device of claim 1, wherein the microphone housing is electrically connected with the ground through a conductive path, and
wherein the electronic device further comprises a capacitor disposed on the conductive path.

8. The electronic device of claim 1, wherein the microphone module is disposed at a point on the PCB adjacent to a first side surface at an upper end of the electronic device among side surfaces of the housing.

9. The electronic device of claim 1, wherein the conductive member is configured to operate as a diversity antenna.

10. The electronic device of claim 1, wherein the PCB comprises a plurality of conductive layers, and
wherein the ground is formed on a first layer among the plurality of conductive layers of the PCB.

11. The electronic device of claim 1, further comprising a switching module comprising a switch at least one lumped element electrically connected with the microphone housing.

12. The electronic device of claim 11, wherein the wireless communication circuit is configured to control the switching module to perform impedance matching in response to the designated frequency band.

13. The electronic device of claim 1, wherein the microphone housing comprises at least one hole formed inside the microphone housing to face in a second direction opposite to the first direction, and
wherein a sound is input to the microphone module through the at least one hole.

14. The electronic device of claim 1, further comprising a universal serial bus (USB) connector disposed on the side surface of the housing,
wherein the microphone housing is disposed adjacent to the USB connector.

15. The electronic device of claim 1, wherein the specified frequency band comprises a frequency band within a range from 2,375 MHz to 2,600 MHz.

16. An electronic device comprising:
a housing forming an inner space of the electronic device, a part of the housing comprising a conductive member;
a printed circuit board (PCB) disposed in the inner space and including a ground;
a microphone module comprising a microphone housing disposed at a point on the PCB adjacent to a side surface of the housing, the microphone housing being electrically connected with the ground; and
a wireless communication circuit disposed on the PCB,
wherein the conductive member is disposed, spaced apart from a surface of the microphone housing by a specified distance or less, and overlapping at least part of the microphone housing with reference to a second direction perpendicular to a first direction in which a rear surface of the electronic device faces,
wherein the conductive member and the microphone housing are coupled and electrically connected,
wherein the wireless communication circuit is configured to transmit and/or receive a signal of a specified frequency band, based on an electrical path comprising the conductive member and the microphone housing, by feeding the conductive member.

17. The electronic device of claim 16, wherein the specified distance is within 0.3 mm.

18. The electronic device of claim 16, wherein the wireless communication circuit is configured to transmit and/or receive a signal of a first frequency band by feeding at a first point of the conductive member, and to transmit and/or receive a signal of a second frequency band by feeding at a second point of the conductive member, different from the first point.

19. The electronic device of claim 18, wherein the first frequency band has a frequency band of a first size, and
wherein the second frequency band has a second frequency band of a second size smaller than the first size.

20. The electronic device of claim 16, wherein the microphone housing is electrically connected with the ground through a conductive path, and
wherein the electronic device further comprises a capacitor disposed on the conductive path.

* * * * *